United States Patent [19]

Pease

[11] Patent Number: 5,122,920

[45] Date of Patent: Jun. 16, 1992

[54] LOW VOLTAGE LOCKOUT CIRCUIT

[75] Inventor: Robert A. Pease, San Francisco, Calif.

[73] Assignee: National Semiconductor Corporation, Santa Clara, Calif.

[21] Appl. No.: 236,110

[22] Filed: Aug. 22, 1988

[51] Int. Cl.$^5$ ............................................... H02H 3/24
[52] U.S. Cl. ........................................ 361/92; 340/663
[58] Field of Search ............... 361/18, 58, 86, 91-98, 361/111; 340/663

[56] References Cited

U.S. PATENT DOCUMENTS 4,463,271  7/1984  Gill, Jr. ........................... 340/663 X
4,789,917  12/1988  Miller ...................................... 361/56

*Primary Examiner*—Todd E. DeBoer

*Attorney, Agent, or Firm*—Gail W. Woodward; Irving S. Rappaport; James W. Rose

[57] ABSTRACT

An integrated circuit is shown in which provision is made for terminating or locking out the operating circuitry when the supply voltage has fallen below a level that can cause anomalous or unreliable operation. Certain selected transistors are provided with saturation sensors which operate to produce a current when the transistors go into collector saturation. When any of the sensors indicates the onset of saturation, clamping circuitry is energized to provide lock out. In addition, a temperature compensated dummy bandgap circuit is included to sense extremely low supply voltages and provide the lockout function under conditions where a reliable saturation indication might not be available.

7 Claims, 2 Drawing Sheets

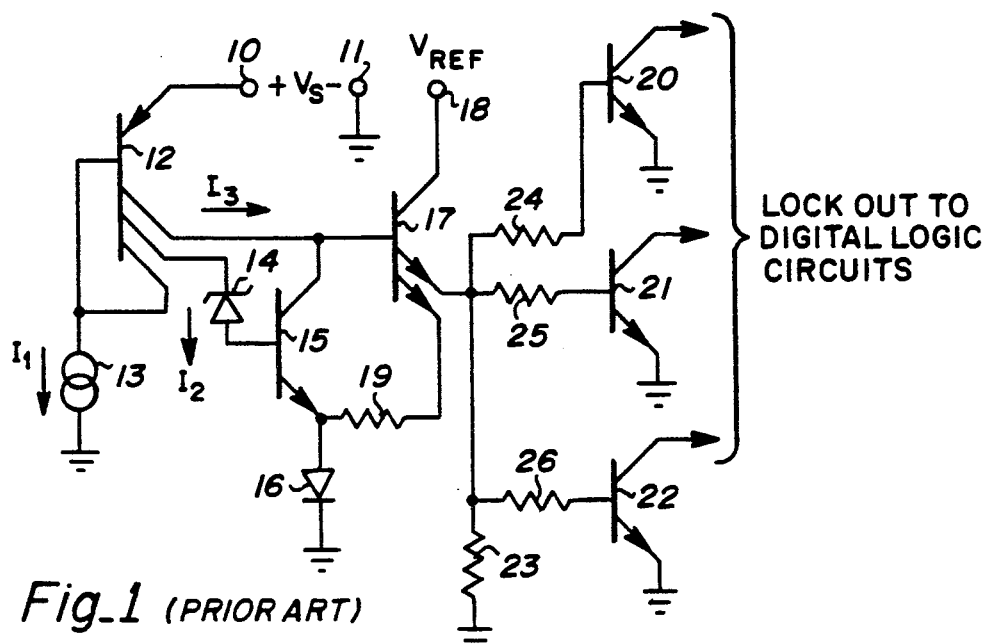
Fig_1 (PRIOR ART)
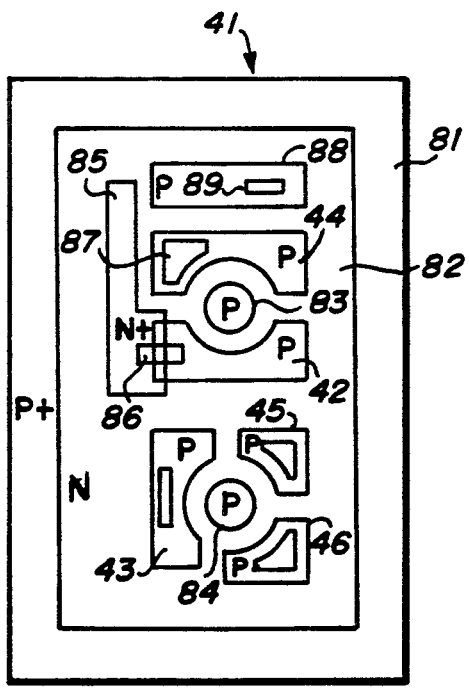
Fig_3
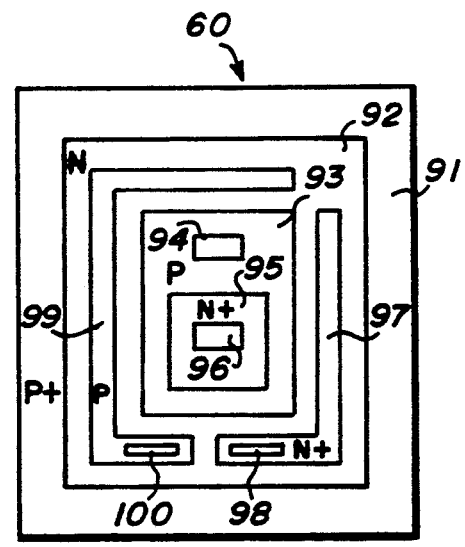
Fig_4

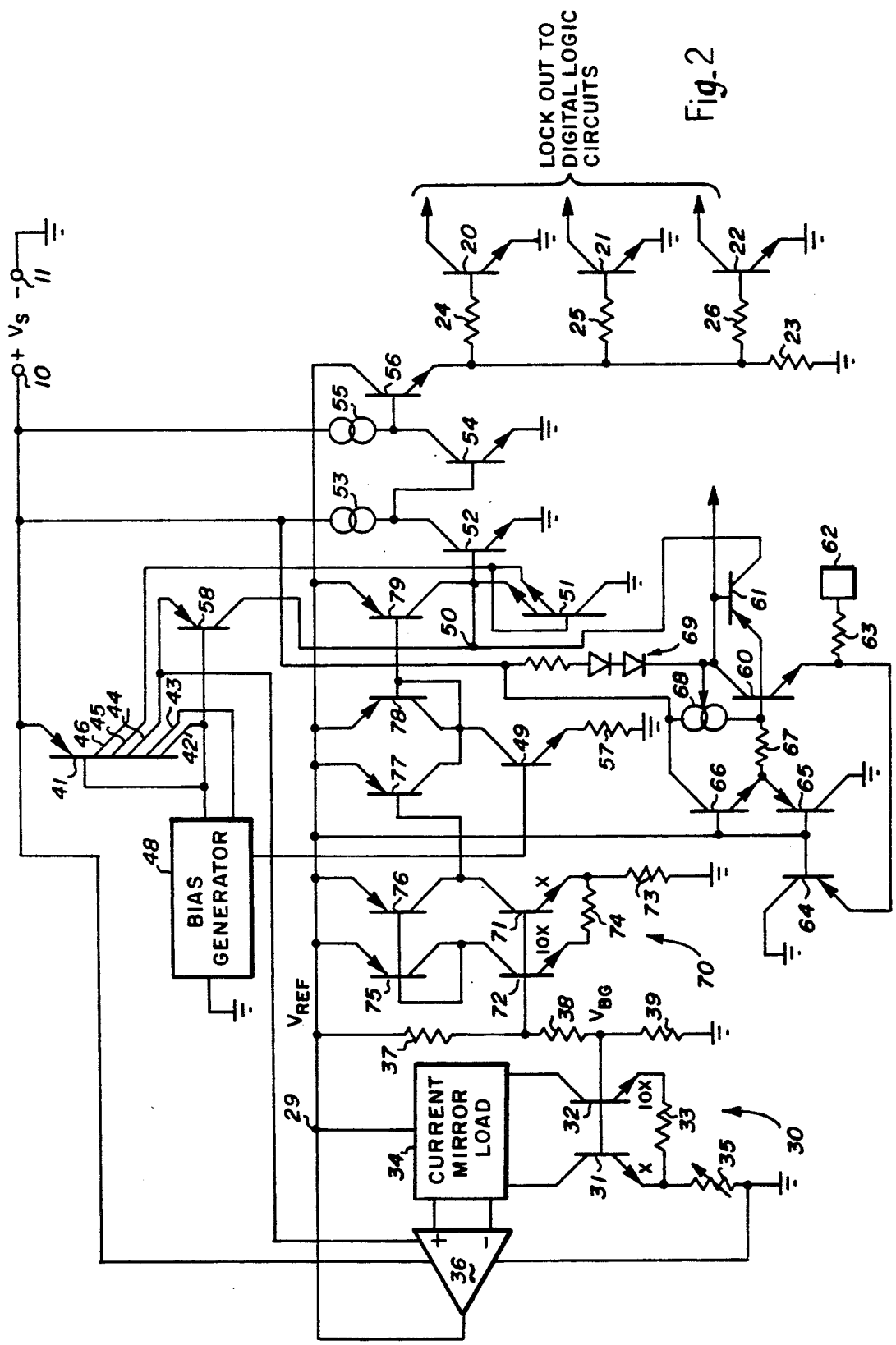
Fig._2

LOW VOLTAGE LOCKOUT CIRCUIT

BACKGROUND OF THE INVENTION

The invention is intended mainly for use in integrated circuit chips where both digital and analog functions are employed simultaneously. Analog, or linear, circuits are employed in conjunction with RTL, TTL, ECL or CMOS logic configurations in many applications. The logic circuit choice is based upon the desired performance characteristics and the analog circuits are selected to provide the required function and to be compatible with the logic circuit manufacturing process.

Typically, an integrated circuit is designed to operate at a specified supply voltage, but it will function normally over a range of supply voltages. Unfortunately, when a logic system is operated at a low voltage it can produce false outputs and thus perform incorrectly. Accordingly, it has become standard practice to provide a circuit function that responds to a low supply voltage condition and shuts off or locks out the digital circuit outputs when the low voltage condition exists. Actually, while the invention mainly relates to the lockout of digital circuits, it can also be applied to linear circuits alone.

One of the best ways of providing a low voltage lockout is to specify or identify a low voltage state and then provide a circuit that will reliably sense it and produce a signal that can be used for the electrical discontinuance of circuit operation. Specifying such a voltage can be a problem because the circuit response can result in a low voltage response tolerance. Also, the circuit that responds to the low voltage can have a tolerance. These combined tolerances can produce a large range of uncertainty so that the circuit design must take into account all of the tolerances involved and respond in such a way that successful lockout will occur under all conditions. These tolerances are exacerbated by temperature effects that must be taken into account. The result is that the low voltage response must be conservatively applied and is therefore considerably higher than would be required for most conditions.

One well known application of combined lineardigital circuitry is the motor control chip. In this device a motor is controlled by the use of high efficiency switching-mode or digital controllers operated by pulses created in response to linear circuitry. It is important to prevent the production of false pulses if the motor is to remain off when it is supposed to be off. Additionally, it is important that the motor not be commanded to drive simultaneously in both forward and reverse directions which could damage the motor and/or its controllers.

DESCRIPTION OF THE PRIOR ART

FIG. 1 is characteristic of the typical prior art low voltage lockout circuit. Although not shown in FIG. 1, it is to be understood that the circuit will include a conventional voltage regulator circuit that will produce $V_{REF}$. Clearly, the supply voltage will have to be at some minimum value above $V_{REF}$ to avoid dropout. The circuits are operated from a $V_S$ power supply connected + to terminal 10 and − to ground terminal 11. A plural or multiple collector lateral transistor 12 has its emitter returned to $+V_S$. Its base is coupled to one collector and to a constant current sink 13. Thus, $I_1$ flows in the lower collector of transistor 12. If all three collectors are of the same effective length and spacing, $I_2$ and $I_3$ each equal $I_1$. $I_2$ flows in zener diode 14 and thereby biases it into reverse breakdown. $I_2$ also flows into the base of transistor 15 and ultimately through diode 16. $I_3$ flows in the collector of transistor 15. Since $I_2 = I_3$ transistor 15 will be in saturation and thereby turn transistor 17 off because resistor 19 returns the lower emitter of transistor 17 to the emitter of transistor 15. Under these conditions the upper emitter of transistor 17 cannot rise appreciably above about 0.1 volt and this will hold transistors 20-22 off. Thus, the digital logic will be permitted to function normally.

If for some reason $V_S$ drops to a low value, at some level, zener diode 14 will cease conduction and $I_2$ will stop flowing. However, $I_1$ and $I_3$ will continue to flow. For example, if the zener voltage is 6.3 volts, when the $V_S$ voltage drops to about 7.6 volts, the zener will start to drop out. With a slight further supply reduction, zener 14 will cease conduction and $I_2$ will cease to flow. This turns off transistor 15. $I_3$, which formerly flowed into transistor 15, will now flow into the base of transistor 17 thereby turning it on. The lower emitter of transistor 17 will operate at a potential of one diode plus the voltage drop across resistor 19. The upper emitter will conduct a similar current and develop a similar voltage drop across resistor 23. This will be coupled, via resistors 24-26, to transistors 20-22 which will thereby be turned on. Conduction in transistors 20-23 will act to disable the related digital circuit and a low voltage lockout is achieved.

As a practical matter, $I_1$, $I_2$ and $I_3$ are made quite small. Actually, the current is made just large enough to reliably bias diode 14 into reverse bias breakdown. Since transistor 17, when on, has $I_3$ flowing into its base, a considerably higher current flows out of the emitters and reliable switching of transistors 20-22 is present. However, the circuit switching level is related to the zener diode breakdown which has a tolerance as well as a temperature coefficient. Furthermore, the transistor circuits have tolerances and all of the tolerances are subject to temperature. Accordingly, it is important that the zener diode voltage be high enough that the low voltage lockout occurs above a critical minimum.

SUMMARY OF THE INVENTION

It is an object of the invention to provide a low voltage lockout based upon the onset of saturation of a transistor in the IC.

It is a further object of the invention to select the transistor most likely to go into saturation and to provide it with a saturation detector which produces a lockout signal at the onset of saturation.

It is a still further object of the invention to select a lateral PNP transistor and a vertical NPN transistor as the most likely to saturate at low supply voltages and to provide them with saturation detectors each one of which will actuate a lockout function at the onset of saturation.

These and other objects are achieved in the following manner. A multiple collector lateral PNP transistor is employed as a plural current source for the linear circuits. A voltage regulator, operating on the silicon bandgap principle, is employed to develop a reference voltage. An NPN transistor in the linear circuitry is selected as the most likely to saturate at low supply voltages and it is provided with a saturation detector that produces an output current at the onset of saturation. A similar detector is provided for the collector of the PNP lateral transistor collector that is most likely to saturate at low supply voltages. These two detectors are coupled to a common circuit node. While one of these two detectors will provide the first indication of saturation it cannot be predicted which one it will be. However, when either one of the two detector-equipped collectors starts to saturate, the circuit node is pulled up and associated circuitry provides the lockout function. The circuit node is also provided with a pull up current derived from a circuit that senses when the supply potential is below the regulator drop out level. This latter function provides for reliable lockout operation for extremely low supply voltages that might fail to reliably operate the saturation detectors.

BRIEF DESCRIPTION OF THE DRAWING

FIG. 1 is a schematic diagram of a commonly used prior art low voltage lockout circuit.

FIG. 2 is a schematic diagram of the circuit of the invention.

FIG. 3 is a topographical showing of the PNP plural collector lateral transistor of FIG. 2 showing the construction of the saturation detector.

FIG. 4 is a topographical showing of the NPN vertical transistor of FIG. 2 showing the construction of the saturation detector.

DESCRIPTION OF THE INVENTION

FIG. 2 is a schematic diagram showing an application of the invention. Where the elements are the same as those of FIG. 1 the same designations are used. Note that the logic lock-out elements 20–26 are the same.

Rail 29 carries $V_{REF}$ which is regulated and is obtained as follows. The heart of the regulator is a bandgap reference circuit 30 which is of the variety set forth in U.S. Pat. No. RE30,586. Transistors 31 and 32 are operated at differential current densities so that $\Delta V_{BE}$ potential appears across resistor 33. A current mirror load 34 determines the collector currents flowing in transistors 31 and 32. To obtain the current density differential the two transistors can be ratioed in area and operated at the same currents or they can be of the same size and their currents ratioed. Alternatively, the areas can be ratioed along with a current ratio. Since the $\Delta V_{BE}$ appears across resistor 33 it is clear that the collector current flowing in transistor 32 is proportional to absolute temperature (PTAT). Accordingly, the current flowing in resistor 35 is also PTAT. If the voltage across resistor 35 added to the $V_{BE}$ of transistor 31 equals the bandgap of silicon extrapolated to absolute zero (about 1.2 volts) the voltage of the bases of transistors 31 and 32 will remain at about 1.2 volts over a wide temperature range. The positive (or PTAT) temperature coefficient of voltage across resistor 35 will be cancelled by the negative temperature coefficient of the $V_{BE}$ of transistor 31.

Current mirror load 34 drives amplifier 36, the output of which sets the level of $V_{REF}$ line 29. The resistor divider composed of resistors 37–39 is set up so that when 1.2 volts appears at the bases of transistors 31 and 32 the desired value of $V_{REF}$ is present on line 29. In the example employed by applicant $V_{REF}$ is +5.00 volts. Resistor 35 is made variable and is adjusted in a production trim so that $V_{REF}$ can be accurately calibrated.

It will be noted that a plural collector lateral transistor 41 has its emitter connected to the $+V_S$ rail. The various collectors 42–46 act as current sources for various circuit functions, some of which will now be discussed.

Collector 42 is returned to the base to create a current mirror in which the current pulled out of collector 42 determines the sourcing capability of all of the other collectors. Collectors 42 and 43 are connected to bias generator 48 which supplies bias for transistor 49. The operation of this circuit is set forth in U.S. Pat. No. 3,930,172. The bias voltage supplied to transistor 49, which controls the current that flows in resistor 57, is controlled by the circuit 48 to be independent of $V_S$. The function of transistor 49 will be further discussed hereinafter.

Circuit node 50 is the lockout trip node and it functions as follows. Transistor 51 is shown as a dual emitter NPN device. Actually, the connection shown operates the transistor in its inverted state so that it functions as a dual collector device with one collector returned to its base. The other collector is returned to node 50. Thus, transistor 51 acts as a pair of low Beta NPN transistors and thereby creates a weak current mirror. The current from collector 45 of transistor 41 flows into the current mirror and transistor 51 will weakly reflect this current out of node 50. Thus, node 50 is pulled low in normal operation. This will turn transistor 52 off. Under this condition the current in source 53 will flow into the base of transistor 54 thereby turning it on. The current flow in transistor 54 will pull the base of transistor 56 low so that it cannot act to bias transistors 20–22 into conduction. Since transistors 20–22 are off, the logic circuits associated with the circuit of FIG. 2 will be fully operative. It is to be understood that the current flowing in the output of current mirror transistor 51 is relatively small and can easily be overpowered.

In an early circuit analysis in the design phase it was determined that collector 44 of transistor 41, which supplies a current to amplifier 36, would be the first to saturate as $V_S$ is lowered. Accordingly, in accordance with the invention, a saturation sensing transistor 58 was added. Its base is common to the base of transistor 41 and its emitter is actually the collector 44. When collector 44 saturates it reemits minority carriers (holes) which can be collected by the collector of transistor 58 which is connected to node 50. Under normal operation when no collector saturation is present, virtually no current will flow in transistor 58. However, when collector 44 saturates, transistor 58 will pull node 50 up because the action of transistor 51 will be overpowered. This will turn transistor 52 on and this will turn transistor 54 off. Thus, the current in source 55 will flow into the base of transistor 56 which will turn on and base current will flow into transistors 20–22. This in turn clamps the digital circuits so as to lock them out. In summary from the above, when node 50 is pulled high the digital circuits are locked out and when node 50 is left alone it will go low and the digital circuits are operative.

Transistor 60 is a vertical NPN device that was determined as another transistor on the IC chip that could go into saturation. Under some conditions it can go into saturation before transistor 41. Accordingly, in accordance with the invention transistor 60 is provided with a saturation detector 61 which also has its collector connected to node 50. Thus, when transistor 60 goes into saturation, transistor 61 will pull node 50 high and the digital circuits will be locked out.

Transistor 60 has its emitter returned to IC pad 62 by way of resistor 63. Pad 62 can be left open or returned to either $+V_S$ or ground. In the cases of open or return to $+V_S$, transistor 64 clamps the emitter of transistor 60 to $V_{REF}+V_{BE}$ or one diode above the potential on line 29. Transistors 65 and 66 clamp the base return circuit of transistor 60 within a range of $\pm V_{BE}$ of $V_{REF}$. Their emitters are coupled to the base of transistor 60 by way of resistor 67. Current source 68 supplies currents to the base of transistor 60 to render it conductive. The current in source 68 is established by a current reflection from the current flowing in elements 69, which are in series with the collector of transistor 60. The current in source 68 will largely flow in resistor 67 and in transistor 65 to ground.

When terminal 62 is left open or is returned to ground, by way of a high value resistor (greater than 100 k ohms), there is little chance that transistor 60 will saturate. However, if a moderate resistance (20 k ohms or less) is present between terminal 62 and ground, it is likely that transistor 60 will saturate first as $V_S$ is lowered. This is when transistor 61 becomes important. When transistor 60 saturates, the base to emitter potential of transistor 61 will turn it on and the collector will pull node 50 high.

From the above it can be seen that when either transistors 58 or 61 sense saturation, node 50 will be pulled high to invoke digital circuit lockout. As $V_S$ is lowered still further a point will be reached where $V_{REF}$ also decreases. At this point, regulator 30 can be regarded as dropped out. In other words, the potential on line 29 is no longer regulated and will fall off as $V_S$ decreases further. Under this condition the transistor saturation condition may no longer be a reliable indicator of reduced $V_S$. A condition of saturation that developed as $V_S$ was reduced may disappear as $V_S$ is lowered still further. Therefore, some means of responding to the still lower $V_S$ voltage is in order.

A reference circuit 70 operates as a dummy regulator and as such duplicates the reference circuit associated with reference 30. Circuit 20 is called a dummy regulator because it is configured as a regulator, but does not regulate. Current density ratioed transistors 71 and 72 have their emitters commonly returned to ground by resistor 73 and the $\Delta V_{BE}$ appears across resistor 74. Thus, transistor 71 is the high current density device. Load transistors 75 and 76 respectively supply collector currents to transistors 72 and 71. They duplicate the action of load 34. The bases of transistors 71 and 72 are connected to the juncture of resistors 37 and 38. This ensures that transistors 71 and 72 are operated at a potential that normally exceeds the bandgap reference by about 100 millivolts. This means that the collector at transistor 71 will normally be low. This will force transistor 77 into conduction so that the collector of transistor 49 will be high. Thus, the current flowing in transistor 49 (and resistor 57) will also flow through transistor 77 from line 29. Under this condition neither transistor 78 nor transistor 79 will conduct.

For low $V_S$ values when the $V_{REF}$ level is lost and line 29 falls below 5 volts, a point will be reached where the bases of transistors 71 and 72 will fall below the silicon bandgap reference established by circuit 70. When this happens the collector of transistor 71 will go high and turn off transistor 77. Now, the current flowing in transistor 49 will flow in diode-connected transistor 78. Since transistor 79 is connected into a current mirror configuration, the current in transistor 78 is reflected into node 50. Thus, as long as the bases of transistors 71 and 72 are below bandgap, node 50 will be held high regardless of the performance of transistors 58 and 61. This ensures reliable digital circuit lockout at very low $V_S$ values.

EXAMPLE

The circuit of FIG. 2 was constructed using conventional monolithic silicon, junction isolated elements. FIG. 3 illustrates the construction of transistor 58 and its relationship to transistor 41. The drawing shows the topography of the various transistor elements, but the oxide, passivation and metallization have been omitted for clarity. The drawing portrays a portion of an IC chip surface with ring 81 representing a P+ isolation diffusion that completely penetrates an N type epitaxial layer. Thus, region 82, inside ring 81, represents an N type tub that is electrically isolated from the remainder of the chip. Transistor 41 has been constructed using two emitters 83 and 84 which are connected together by metallization (not shown). P-type collectors 42 and 44 are spaced from and substantially surround emmitter 83. Collectors 43, 45 and 46 are spaced from and substantially surround emitter 84. N+ diffused region 85 slightly overlaps collector 42. Region 85 forms an ohmic connection to the N type epitaxial tub 82 and comprises the transistor base.

The rectangle 86 represents the area of an oxide contact cut within which subsequently applied metallization simultaneously contacts regions 42 and 85 where they overlap. This contact connects collector 42 to the transistor base. A similar contact region 87 makes provision for an electrical connection to collector 44. It will be noted that another P type region 88 exists just outboard of collector 44. Region 89 represents the metallic connection to collector 88. In normal operation collector 44 collects substantially half of the minority carriers injected by emitter 83. Very few, if any, of these carriers find their way to collector 88 and its current is close to zero. However, when collector 44 saturates it proceeds to reemit its collected carriers and adjacent collector 88 will collect them. Thus, transistor 58 exists as a lateral transistor in which the emitter is collector 44, the base is the N type material existing between collectors, and its collector is region 88. Because of its geometry transistor 58 actually exists electrically only when collector 44 goes into saturation.

FIG. 4 is a showing similar to that of FIG. 3, but relating to the topography of transistor 60. Ring 91 represents a P+ isolation ring that isolates N type tub 92 from the rest of the IC chip. P region 93 represents the P type transistor base and rectangle 94 is where an ohmic base contact is made to metallization (not shown). N+ region 95 is the emitter while rectangle 96 is the emitter contact. N+ region 97 is an N+ diffusion that makes ohmic contact to N type tub 92 and is in turn contacted via rectangle 98. P diffusion 99 is spaced apart from and confronting base 93 while rectangle 100 is a contact region thereto. Thus, base 93 of transistor 60 forms an emitter of lateral transistor 61 in which 99 is the collector and the intervening N type material forms the lateral transistor base.

While not shown in FIGS. 3 and 4, each of the active transistors is located over an N+ buried layer created between the silicon substrate wafer and its epitaxial layer. Such N+ buried layers are well known in IC construction.

| COMPONENT | VALUE | UNITS |
| --- | --- | --- |
| Resistor 23 | 5 | k ohms |
| Resistor 24 | 4 | k ohms |
| Resistor 25 | 4 | k ohms |
| Resistor 26 | 4 | k ohms |
| Resistor 33 | 2 | k ohms |
| Resistor 35* | 9.5–11.128 | k ohms |
| Resistor 37 | 7.23 | k ohms |
| Resistor 38 | 300 | ohms |
| Resistor 39 | 2.46 | k ohms |
| Current Source 53 | 2 to 50 | microamperes |
| Current Source 55 | 200 | microamperes |
| Resistor 57 | 2.03 | k ohms |
| Resistor 63 | 100 | ohms |
| Resistor 67 | 100 | ohms |
| Resistor 73 | 9 | k ohms |
| Resistor 74 | 2 | k ohms |
| Current Source 68** | 1–1000 | microamperes |

*Resistor 35 is trimmed to set $V_{REF}$ at 5.00 volts.
**Current source 68 is programmed by the current in transistor 60 which is set by the element connected to terminal 62.

The circuit was designed to operate over a supply voltage range of 9 to 40 volts. $V_{REF}$ was 5 volts $\pm 1\%$ over the entire supply range. As the supply voltage as lowered, with terminal 62 open, it was found that the lockout circuits became operative at about 8.8 volts. The lockout remained active down to about 2 volts.

The invention has been described and an operating example detailed. When a person skilled in the art reads the foregoing description, alternatives and equivalents, within the spirit and intent of the invention, will be apparent. For example, while a combined digital/linear embodiment is detailed in the example, the invention could be employed in an all linear structure. Accordingly, it is intended that the scope of the invention be limited only by the claims that follow.

I claim:

1. An integrated circuit including both linear and digital circuits and a low voltage lockout circuit operative from a power supply that can have lower than normal voltage level, said circuit, said circuit comprising:

a circuit node;

means coupled to said circuit node and operative to provide a lockout function for said digital circuits when the supply voltage is below a predetermined minimum value;

means located in at least one transistor for sensing the onset of saturation and for providing an output current related to said onset of saturation; and means for coupling said output current to said circuit node whereby the onset of saturation acts to provide said lockout function.

2. An integrated low voltage lockout circuit operative from a power supply that can have a lower than normal voltage level, said circuit comprising:

a circuit node;

means coupled to said circuit node and operative to provide a lockout function when the supply voltage is below a predetermined minimum value;

relatively weak means coupled to said circuit node for pulling it low when normal operation is to be achieved;

means located in at least one transistor for sensing the onset of saturation and for providing an output current related to said onset of saturation; and means for coupling said output current to said circuit node whereby the onset of saturation acts to provide said lockout function.

3. The integrated circuit of claim 2 wherein said circuit node is pulled high to overcome said relatively weak pull down means to actuate said lockout function.

4. The integrated circuit of claim 1 wherein a plurality of transistors in said linear circuits include means for sensing the onset of saturation and each means for sensing is coupled to said circuit node.

5. The integrated circuit of claim 4 wherein said one transistor is a plural collector lateral transistor and one of said collectors is to provide the saturation indication, said means for sensing saturation comprising an additional collector located on the side one of said collectors opposite the emitter and wherein said additional collector acts with the transistor base and said collector acts in saturation to reemit collected carriers to said additional collector which in turn applies the current to said circuit node.

6. The integrated circuit of claim 3 wherein said one transistor is a vertically arrayed structure in which said means for sensing saturation comprises a lateral collector spaced from and facing the edge of the base region of said one transistor and wherein said lateral collector becomes active when said one transistor saturates and the resultant lateral transistor supplies current to said circuit node.

7. The integrated circuit of claim 4 wherein said linear circuit configuration includes a voltage regulator that maintains a supply level constant in the presence of varying line and load conditions, said voltage regulator including a reference voltage generator that produces a bandgap-related potential, said lockout circuit further including a dummy regulator circuit operated at a voltage increment higher than said bandgap related potential, said dummy regulator circuit being coupled to drive a current generator coupled to supply current to said circuit node when said dummy regulator circuit senses a below bandgap potential thereby providing a temperature compensated low voltage lockout function.

* * * * *